(12) United States Patent
Gan et al.

(10) Patent No.: US 9,171,823 B2
(45) Date of Patent: Oct. 27, 2015

(54) CIRCUIT MODULE WITH MULTIPLE SUBMODULES

(75) Inventors: KahWee Gan, Singapore (SG); Yaohuang Huang, Singapore (SG)

(73) Assignee: STMICROELECTRONICS PTE LTD, Singapore (SG)

( * ) Notice: Subject to any disclaimer, the term of this patent is extended or adjusted under 35 U.S.C. 154(b) by 214 days.

(21) Appl. No.: 13/341,890

(22) Filed: Dec. 30, 2011

(65) Prior Publication Data
US 2013/0170169 A1 Jul. 4, 2013

(51) Int. Cl.
| | |
|---|---|
| H05K 1/18 | (2006.01) |
| H01L 23/12 | (2006.01) |
| H01L 23/053 | (2006.01) |
| H05K 1/00 | (2006.01) |
| H05K 1/11 | (2006.01) |
| H01R 43/00 | (2006.01) |
| H05K 3/30 | (2006.01) |
| H01L 25/03 | (2006.01) |
| H01L 23/00 | (2006.01) |
| H01L 23/538 | (2006.01) |
| H01L 25/065 | (2006.01) |

(Continued)

(52) U.S. Cl.
CPC ............ *H01L 25/03* (2013.01); *H01L 23/5389* (2013.01); *H01L 24/24* (2013.01); *H01L 24/82* (2013.01); *H01L 25/0652* (2013.01); *H01L 25/0657* (2013.01); *H01L 25/50* (2013.01); H01L 21/561 (2013.01); H01L 2224/12105 (2013.01); H01L 2224/131 (2013.01); H01L 2224/16237 (2013.01); H01L 2224/24146 (2013.01); H01L 2224/821 (2013.01); H01L 2224/8203 (2013.01); H01L 2225/06517 (2013.01); H01L 2225/06524 (2013.01); Y10T 29/49117 (2015.01); Y10T 29/49204 (2015.01)

(58) Field of Classification Search
CPC . G06F 15/78; G06F 15/7807; G06F 15/7835; H01L 23/02; H01L 23/28; H01L 23/48; H01L 23/50; H01L 23/52; H01L 23/538; H01L 21/00; H01L 21/02; H01L 21/02104; H01L 29/40; H05K 7/00
USPC .................. 361/761, 762, 764; 257/700, 725; 174/258, 262, 264; 29/825, 832, 874
See application file for complete search history.

(56) References Cited

U.S. PATENT DOCUMENTS

| | | | |
|---|---|---|---|
| 6,133,637 A * | 10/2000 | Hikita et al. ................... | 257/777 |
| 6,225,699 B1 | 5/2001 | Ference et al. | |
| 6,294,406 B1 | 9/2001 | Bertin et al. | |

(Continued)

*Primary Examiner* — Courtney Smith
*Assistant Examiner* — Zhengfu Feng
(74) *Attorney, Agent, or Firm* — Seed IP Law Group PLLC

(57) ABSTRACT

An embodiment of a circuit module includes module nodes, a first submodule, a second submodule, and a conductive structure. The first submodule has a first submodule node, and the second submodule is disposed over the first submodule and has a second submodule node. The conductive structure couples the first submodule node to one of the module nodes and couples the second submodule node to one of the module nodes. Another embodiment of a circuit module includes module nodes, a first submodule, a second submodule, and a conductive structure. The first submodule has first submodule nodes, and the second submodule is disposed over the first submodule and has second submodule nodes. The conductive structure couples one of the first and second submodule nodes to one of the module nodes and couples one of the first submodule nodes to one of the second submodule nodes.

19 Claims, 7 Drawing Sheets

(51) Int. Cl.
*H01L 25/00* (2006.01)
*H01L 21/56* (2006.01)

(56) References Cited

U.S. PATENT DOCUMENTS

| | | | |
|---|---|---|---|
| 6,558,978 B1 | 5/2003 | McCormick | |
| 6,633,081 B2 * | 10/2003 | Sahara et al. | ................ 257/738 |
| 7,605,476 B2 * | 10/2009 | Gritti | ........................... 257/777 |
| 8,617,987 B2 | 12/2013 | Gan et al. | |
| 8,754,514 B2 | 6/2014 | Yu et al. | |
| 8,766,422 B2 | 7/2014 | Gan et al. | |
| 2001/0010627 A1 | 8/2001 | Akagawa | |
| 2008/0224306 A1 * | 9/2008 | Yang | ............................. 257/725 |
| 2010/0259882 A1 * | 10/2010 | Song | ....................... 361/679.32 |
| 2012/0282767 A1 | 11/2012 | Jin et al. | |

* cited by examiner

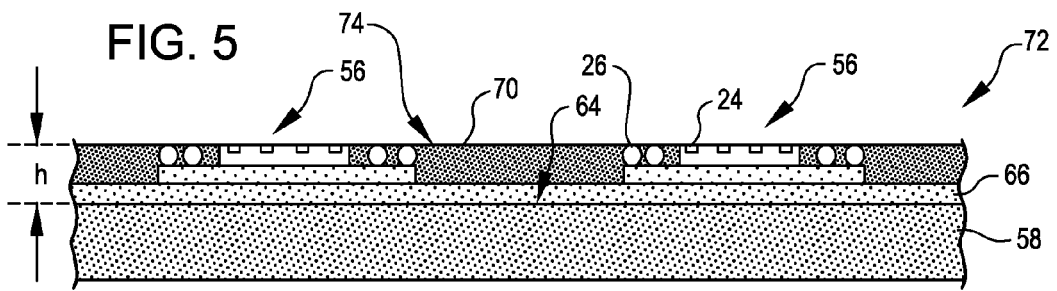
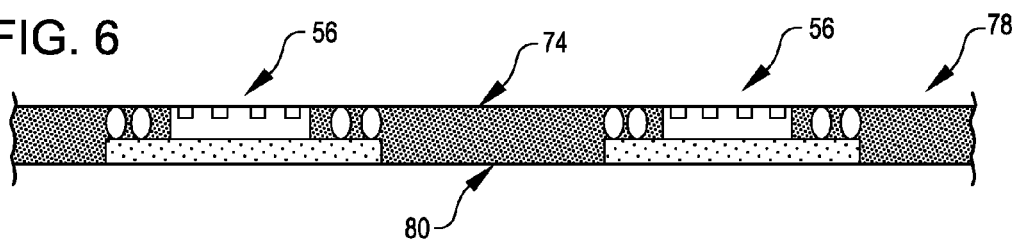
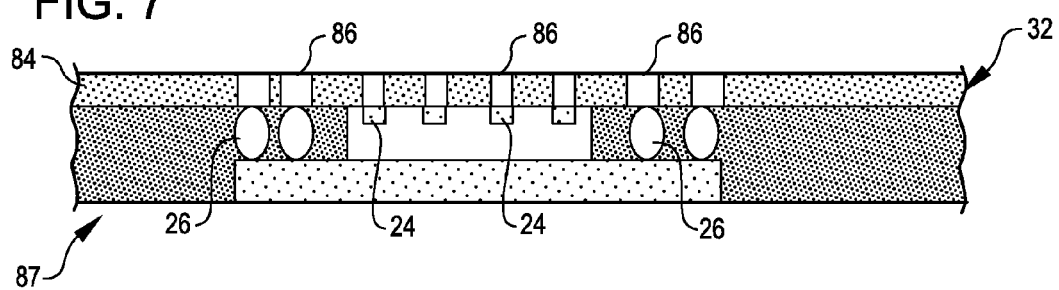
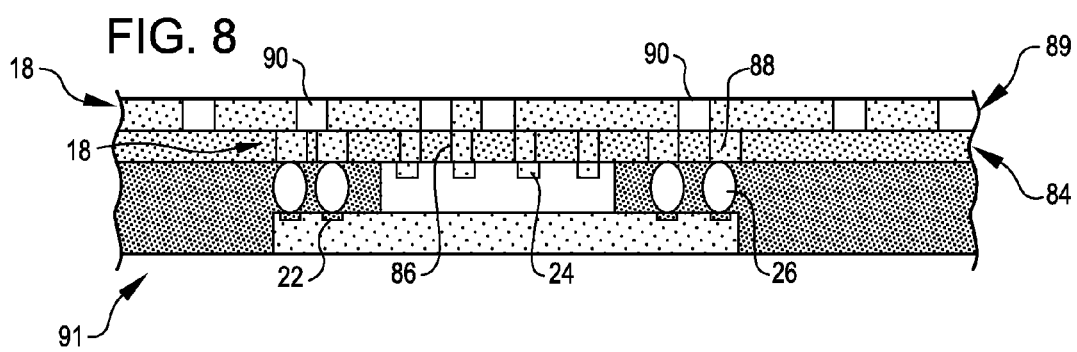

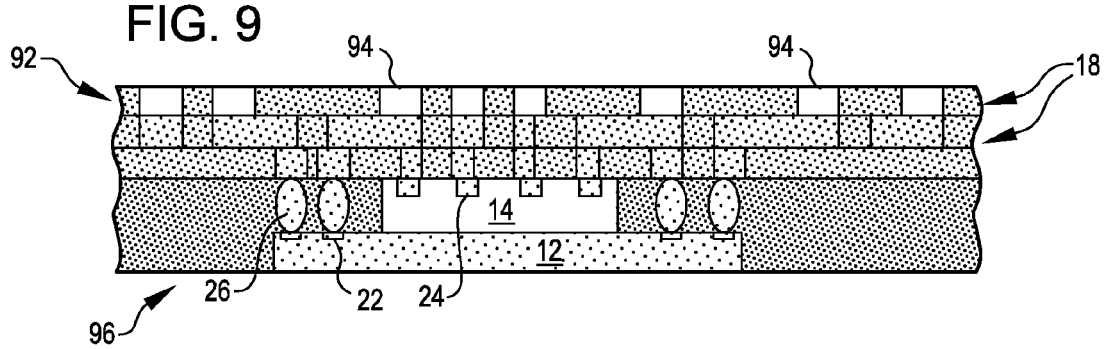
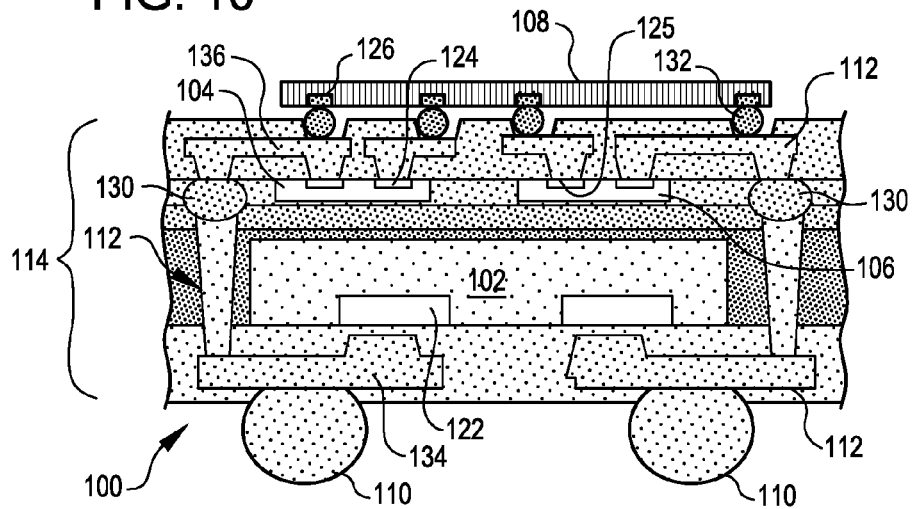
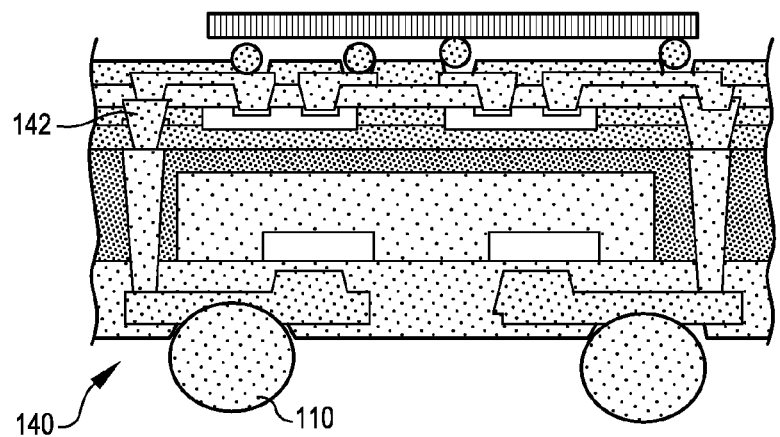

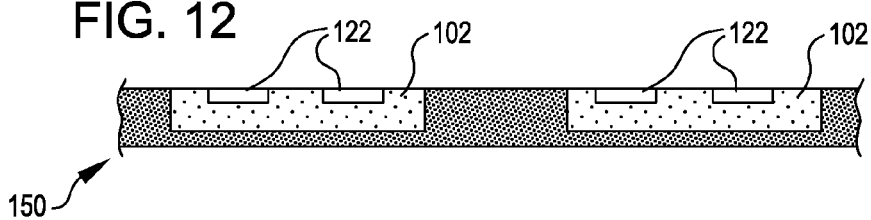
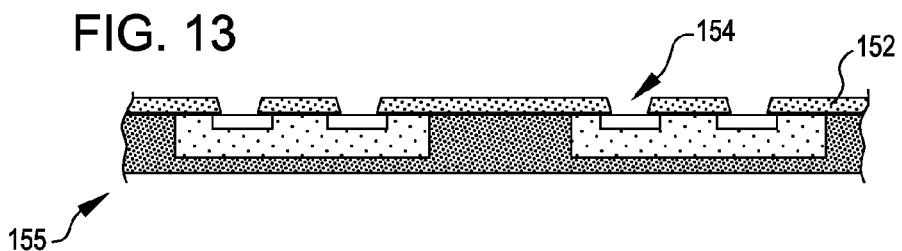
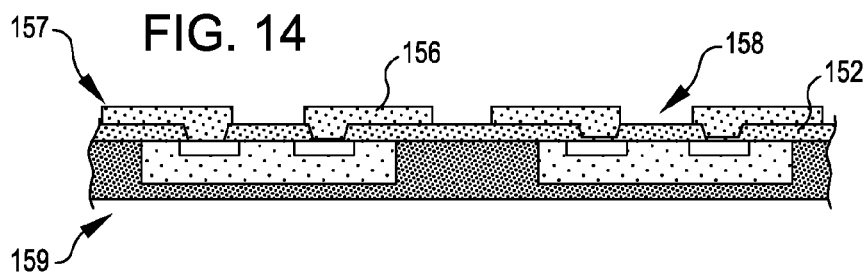
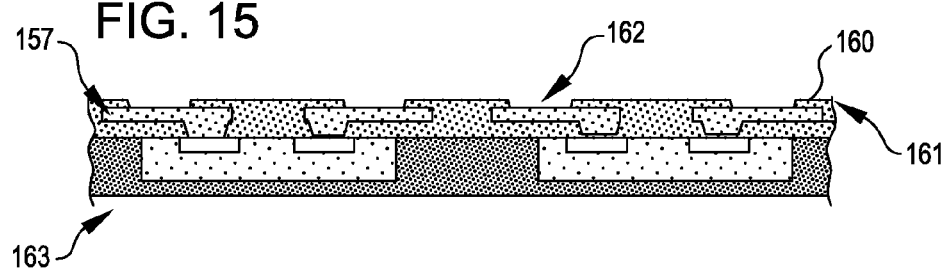
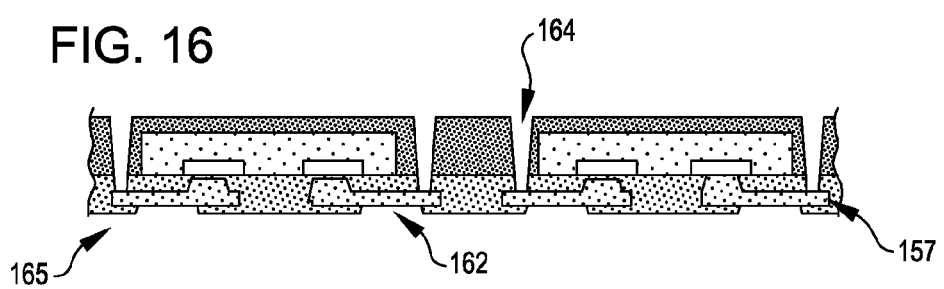

CIRCUIT MODULE WITH MULTIPLE SUBMODULES

SUMMARY

An embodiment of a circuit module includes module nodes, a first submodule, a second submodule, and a conductive structure. The first submodule has a first submodule node, and the second submodule is disposed over the first submodule and has a second submodule node. The conductive structure couples the first submodule node to one of the module nodes and couples the second submodule node to one of the module nodes.

Another embodiment of a circuit module includes module nodes, a first submodule, a second submodule, and a conductive structure. The first submodule has first submodule nodes, and the second submodule is disposed over the first submodule and has second submodule nodes. The conductive structure couples one of the first and second submodule nodes to one of the module nodes and couples one of the first submodule nodes to one of the second submodule nodes.

For example, such a circuit module may occupy less board space than would the first and second submodules if laid out side by side, and multiple ones of such a circuit module may be manufactured simultaneously to reduce manufacturing complexity and cost.

BRIEF DESCRIPTION OF THE DRAWINGS

Unless otherwise noted, like numbers reference like components throughout the following drawings.

FIGS. 2-9 are cutaway side views of the circuit module of FIG. 1 at respective stages of its manufacture according to an embodiment.

FIG. 10 is a cutaway side view of another embodiment of a circuit module.

FIG. 11 is a cutaway side view of another embodiment of a circuit module.

FIGS. 12-18 are cutaway side view of the circuit modules of FIGS. 10 and 11 at respective stages of their manufacture according to an embodiment.

DETAILED DESCRIPTION

The following discussion is presented to enable a person skilled in the art to make and use the subject matter disclosed herein. The general principles described herein may be applied to embodiments and applications other than those detailed above without departing from the spirit and scope of the present detailed description. The present disclosure is not intended to be limited to the embodiments shown, but is to be accorded the widest scope consistent with the principles and features disclosed or suggested herein.

Figure 1:
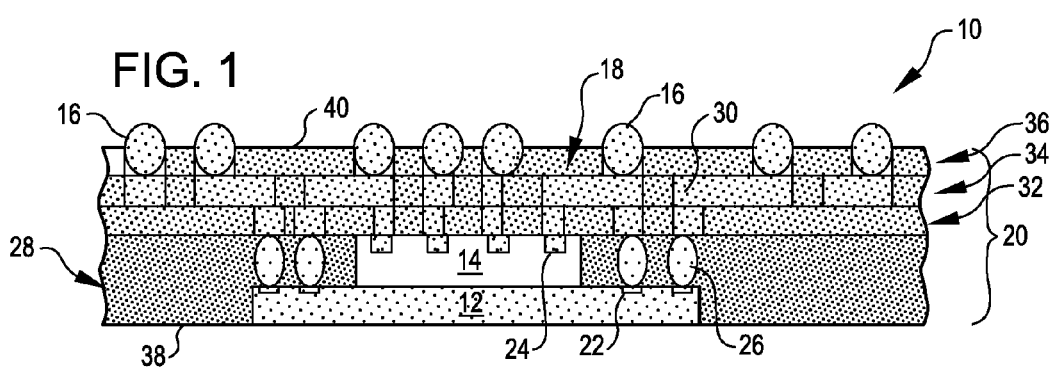
FIG. 1 is a cutaway side view of an embodiment of a circuit module.

FIG. 1 is a cutaway side view of an embodiment of a circuit module 10, which may be called a three-dimensional (3D) circuit module because it includes stacked submodules 12 and 14. As discussed below, the circuit module 10 may occupy a reduced space on a circuit board as compared to arranging the stacked submodules 12 and 14 side by side on the circuit board. Also as discussed below, the circuit module 10 may lend itself to mass production, which may reduce the manufacturing costs and complexities as compared to conventional manufacturing processes that produce circuit modules one at a time.

Still referring to FIG. 1, in addition to the submodules 12 and 14, the circuit module 10 includes external module pins 16 (hereinafter external module nodes 16), a conductive interconnect structure 18 that intercouples the submodules to one another and that couples the submodules to the module nodes, and a package 20.

The submodule 12 may be a circuit component such as a packaged or unpackaged active component (e.g., a transistor or a diode) or integrated circuit (e.g., a controller such as a microprocessor), an integrated-circuit die (e.g., a system on a chip), a packaged or unpackaged passive component (e.g., an inductor), or a circuit module that includes multiple circuit components like the circuit module 10—in the latter example, this means that a circuit module (here the submodule 12) may be a component of the larger circuit module 10. Furthermore, the submodule 12 includes submodule terminals or pads 22 (hereinafter submodule nodes 22) that are electrically coupled to the interconnect structure 18 and that may be formed from any suitable conductive material such as aluminum, copper, or gold, or from a suitable combination of conductive materials.

The submodule 14 is disposed over the submodule 12, and like the submodule 12, may be a circuit component such as a packaged or unpackaged active component or integrated circuit, an integrated-circuit die, a packaged or unpackaged passive component, or a circuit module that includes multiple circuit components. The submodule 14 includes submodule terminals or pads 24 (hereinafter submodule nodes 24) that are electrically coupled to the interconnect structure 18 and that may be formed from any suitable conductive material such as aluminum, copper, or gold, or from a suitable combination of conductive materials. Furthermore, the submodule 14 may be attached to the submodule 12, e.g., with an adhesive such as a thermally conductive glue.

The interconnect structure 18 electrically couples one or more of the module nodes 16 to one or more of the submodule nodes 22 and 24, also electrically couples one or more of the submodule nodes 22 to one or more of the submodule nodes 24. Therefore, the interconnect structure 18 allows the submodules 12 and 14 to communicate with each other and with components external to the circuit module 10. The interconnect structure 18 may be formed from any suitable conductive material such as aluminum, copper, solder, or from a suitable combination of conductive materials, and may be disposed in one or more levels. For example, in an embodiment, the interconnect structure 18 includes solder balls 26 disposed in a first level 28 of the circuit module 10, copper traces 30 in second and third levels 32 and 34 of the circuit module, and more solder balls, which form the module nodes 16, in a fourth level 36 of the circuit module.

The package 20 includes a first portion 38, which may be formed from a plastic material such as epoxy resin, and a second portion 40, which may be formed from a passivation material disposed in one or more levels of the circuit module 10, and which passivation material may include any suitable passivation material or combination of materials such as silicon dioxide ($SiO_2$), benzocyclobutene (BCB), polybenzoxazole (PBO), or polyimide (PI). For example, in an embodiment, the passivation material that forms the second portion 40 of the package 20 is disposed in the second, third, and fourth levels 32, 34, and 36 of the circuit module 10.

Still referring to FIG. 1, alternate embodiments of the circuit module 10 are contemplated. For example, although the circuit module 10 is described as including only two submodules 12 and 14, the circuit module may include more or fewer submodules that are stacked or that are arranged side by side. Furthermore, although described as occupying four contiguous levels of the circuit module 10, the interconnect structure 18 may occupy more or fewer than two levels, and may occupy noncontiguous levels. Similarly, although described as occupying three levels of the circuit module 10, the passivation material may occupy more or fewer than three levels, and may occupy noncontiguous levels.

FIGS. 2-9 are diagrams of an embodiment of the circuit module 10 of FIG. 1 at respective stages of a manufacturing process according to an embodiment in which the submodule 12 is a packaged integrated circuit that includes one or more integrated-circuit dies and that is formed by any suitable process, and in which the submodule 14 is an unpackaged integrated-circuit die that is formed by any suitable process.

Figure 2:
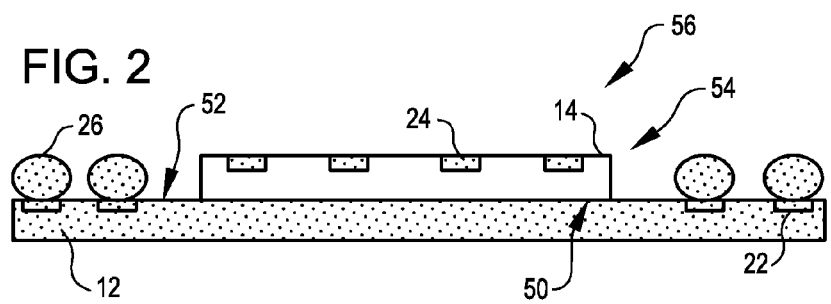
Figure 3:
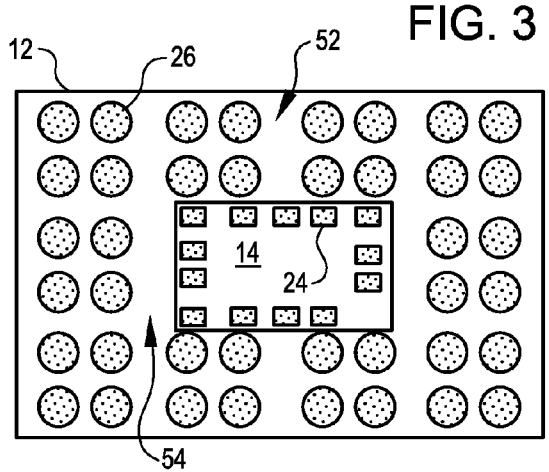

Referring to FIGS. 2 and 3, a surface 50 of the submodule 14 is placed (e.g., with a pick-and-place machine) on a surface 52 of the first module 12 in a space 54 defined by the solder balls 26 to form a first intermediate assembly 56. The surface 50 of the submodule 14 may be secured to the surface 52 of the submodule 12 with a suitable adhesive, which may have a low thermal resistance to promote heat transfer. Furthermore, in an embodiment, the height of the solder balls from the surface 52 is approximately equal to the height of the submodule nodes 24 from the surface 52.

Still referring to FIGS. 2 and 3, one or more other first intermediate assemblies 56 are formed, for example, in a similar manner.

Figure 4:
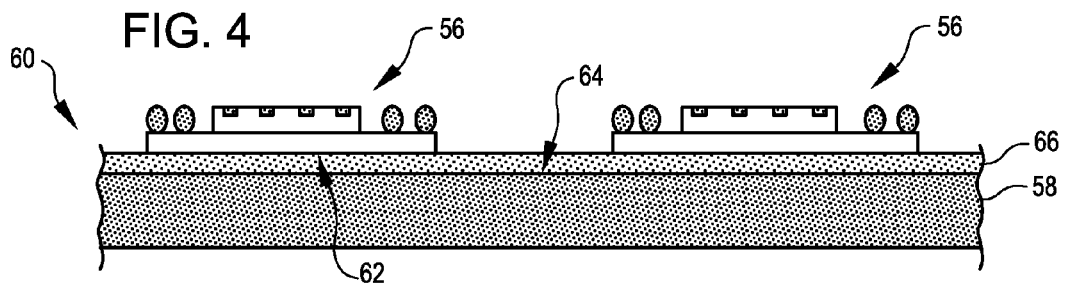

Next, referring to FIG. 4, the first intermediate assemblies 56 (only two first intermediate assemblies are shown in FIG. 4) are arranged on a temporary carrier 58 in a two-dimensional array (the second dimension extends in and out of the page of FIG. 4) to form a second intermediate assembly 60. In an embodiment, surfaces 62 of the intermediate assemblies 56 are attached to a surface 64 of the carrier 58 with an adhesive 66 such as double-sided tape. Furthermore, in an embodiment, the carrier 58 is a plate that is made from any suitable carrier material such as metal or glass, or from a suitable combination of such materials, and this plate, and thus the second intermediate assembly 60, may have any suitable shape such as round (e.g., like a semiconductor wafer), rectangular, or triangular.

Then, referring to FIG. 5, a packaging material 70, such as an epoxy resin, is disposed over the carrier 58 and the adhesive 66 in the spaces between the first intermediate assemblies 56 by, for example, injection molding, to form a third intermediate assembly 72. The height h of the material 70 above the surface 64 of the carrier 58 is such that the submodule nodes 24 and at least a portion of each solder ball 26 remain exposed. Furthermore, if a front surface 74 of the packaging material 70 is insufficiently planar, then one may planarize the surface 74 in any suitable manner, such as using reflow or chemical-mechanical polishing.

Next, referring to FIG. 6, after the packaging material 70 cures, the carrier 58 and adhesive 66 (not shown in FIG. 6) are removed in any suitable manner to form a wafer-like third intermediate structure 78. If the front surface 74 or a back surface 80 of the packaging material 70 is not planar, then one may planarize the surface(s) in any suitable manner.

FIGS. 7-9 are diagrams of an embodiment of the circuit module 10 of FIG. 1 at respective subsequent stages of a manufacturing process according to an embodiment; although only a structure portion pertaining to a single circuit module 10 is shown in each of FIGS. 7-9, it is understood that the other structure portions are processed approximately simultaneously, and in approximately the same way, as the illustrated structure portion.

Referring to FIG. 7, a layer 84 of passivation material is formed over the third intermediate structure 78 (FIG. 6), and openings 86 that are aligned with the solder balls 26 and the submodule nodes 24 are formed in the layer. This results in a fourth intermediate structure 87.

Then, referring to FIG. 8, a conductive material 88 is formed in the openings 86 (FIG. 7) to form a portion of the interconnect structure 18, and a layer 89 of the conductive material 88 is formed over the layer 84.

Next, still referring to FIG. 8, openings 90 are formed in the layer 89.

The layer 89 with the openings 90 (i.e., the patterned layer 89) may be called a redistribution portion or redistribution layer, and, as discussed above in conjunction with FIG. 1, this redistribution portion of the interconnect structure 18 couples certain ones of the solder balls 26 (and thus certain ones of the submodule nodes 22) to certain ones of the submodule nodes 24, and also couples certain ones of the solder balls 26 and submodule nodes 24 to the module nodes 16 (FIG. 1) as discussed below in conjunction with FIGS. 9 and 1.

The steps described in conjunction with FIG. 8 result in a fourth intermediate structure 91.

Then, referring to FIG. 9, a layer 92 of a passivation material is formed in the openings 90 (FIG. 8) of, and over, the layer 89.

Next, still referring to FIG. 9, openings 94 are formed in the layer 92 to expose underlying sections of the interconnect structure 18 in the layer 89 and to form a fifth intermediate structure 96. Although in FIG. 9 openings 94 are formed over all illustrated sections of the interconnect structure 18, in an embodiment there may be one or more sections of the interconnect structure over which no opening 94 is formed. For example, there may be no opening 94 formed over a section of the interconnect structure 18 that couples a submodule node 24 to a solder ball 26, where neither the submodule node nor the solder ball is to be coupled to a module node 16 (FIG. 1).

Referring again to FIG. 1, solder balls are formed in the openings 94 (FIG. 9) to form the module nodes 16, resulting in a sixth intermediate structure, and the circuit module 10 and the other circuit modules not shown in FIG. 1 are formed by splicing them from the sixth intermediate structure.

As discussed above in conjunction with FIG. 1, in an embodiment, to manufacture an even more dense circuit module, two or more of the circuit modules 10 can be used as the submodules 12 and 14 for the process of FIGS. 2-9. And this cycle can be repeated one or more times to manufacture even denser circuit modules.

Referring to FIGS. 1-9, alternate embodiments of the circuit module 10 and the process for manufacturing the circuit module are contemplated. For example, another package may be formed around the package 20. Furthermore, other types of contacts may be used in place of one or more of the solder balls.

FIG. 10 is a cutaway side view of an embodiment of a circuit module 100, which may be referred to as a three-dimensional (3D) circuit module because it includes stacked submodules 102, 104, 106, and 108. As discussed below, the circuit module 100 may occupy a reduced space on a circuit board as compared to arranging the stacked submodules 102, 104, 106, and 108 side by side on the circuit board. Also as discussed below, the circuit module 100 may lend itself to mass production, which may reduce the manufacturing costs and complexities as compared to conventional manufacturing processes that produce circuit modules one at a time.

In addition to the submodules 102, 104, 106, and 108, the circuit module 100 includes external module pins 110 (hereinafter external module nodes 110), a conductive interconnect structure 112 that intercouples the submodules and that couples the submodules to the module nodes, and a package 114.

The submodule 102 may be an integrated-circuit die, or a circuit module that includes multiple circuit components like the circuit module 100—in the latter example, this means that a circuit module (here the submodule 102) may be a component of the larger circuit module 100. Furthermore, the submodule 102 includes submodule terminals or pads 122 (hereinafter submodule nodes 122) that are electrically coupled to the interconnect structure 112 and that may be formed from any suitable conductive material such as aluminum, copper, or gold, or a suitable combination of conductive materials.

The submodules 104 and 106 are disposed over the submodule 102, and may each be a circuit component such as a packaged or unpackaged active component or integrated circuit, an integrated circuit die, a packaged or unpackaged passive component, or a circuit module that includes multiple circuit components. The submodule 104 includes submodule terminals or pads 124 (hereinafter submodule nodes 124) that are electrically coupled to the interconnect structure 112 and that may be formed from any suitable conductive material such as aluminum, copper, or gold, or from any suitable combination of conductive materials. Similarly, the submodule 106 includes submodule terminals or pads 125 (hereinafter submodule nodes 125) that are electrically coupled to the interconnect structure 112 and that may be formed from any suitable conductive material such as aluminum, copper, or gold, or from any suitable combination of conductive materials.

The submodule 108 is disposed over the submodules 102, 104, and 106, and, like the submodules 104 and 106, may be a circuit component such as a packaged or unpackaged active component or integrated circuit, an integrated circuit die, a packaged or unpackaged passive component, or a circuit module that includes multiple circuit components. The submodule 108 includes submodule terminals or pads 126 (hereinafter submodule nodes 126) that are electrically coupled to the interconnect structure 112 and that may be formed from any suitable conductive material such as aluminum, copper, or gold, or from any suitable combination of conductive materials.

The interconnect structure 112 electrically couples one or more of the module nodes 110 to one or more of the submodule nodes 122, 124, 125, and 126, and may also couple various combinations of the submodule nodes 122, 124, and 125 to each other. Therefore, the interconnect structure 112 allows the submodules 102, 104, 106, and 108 to communicate with each other and with components external to the circuit module 100.

The interconnect structure 112 may be formed from any suitable conductive material such as aluminum, copper, solder, or doped polysilicon, or from any suitable combination of conductive materials, and may be disposed in one or more levels of the circuit module 100. For example, in an embodiment, the interconnect structure 112 includes solder balls 130 and 132, solder balls that form the module nodes 110, and copper traces or members 134 and 136 in respective levels of the circuit module 100.

Still referring to FIG. 10, alternate embodiments of the circuit module 100 are contemplated. For example, although the circuit module 100 is described as including only four submodules 102, 104, 106, and 108, the circuit module may include more or fewer submodules that are stacked or arranged side by side in one or more than one dimensions. Furthermore, in addition to the package 114, the circuit module 100 may include an outer package that also encapsulates at least a portion of the submodule 108.

FIG. 11 is a cutaway side view of an embodiment of a circuit module 140, which, in an embodiment, is similar to the circuit module 100 of FIG. 10 except that in the module 140, conductive pillars 142 are used instead of the solder balls 130 of the circuit module 100. The conductive pillars 142 may be formed from any suitable conductive material such as aluminum, copper, or gold, or from any suitable combination of conductive materials.

FIGS. 12-18 are diagrams of embodiments of the circuit module 100 of FIG. 10 and the circuit module 140 of FIG. 11 at respective stages of a manufacturing process according to an embodiment in which the submodules 102, 104, and 106 are integrated-circuit dies that are formed by any suitable process, and in which the submodule 108 is a packaged integrated circuit that includes one or more integrated-circuit dies and that is formed by any suitable process.

FIGS. 19, 21, 23, 25, and 27 are diagrams of an embodiment of the circuit module 100 of FIG. 10 at respective subsequent stages of a manufacturing process according to an embodiment.

And FIGS. 20, 22, 24, 26, and 26 are diagrams of an embodiment of the circuit module 140 of FIG. 11 at respective subsequent stages of a manufacturing process according to an embodiment.

FIG. 12 is a cutaway side view of a wafer 150, which includes multiple submodules 102. Although the wafer 150 is shown as including two submodules 102, the wafer may include more or fewer than two submodules 102 in dimensions parallel and normal to the page of FIG. 12. The wafer 150 may be any suitable type of wafer, such as a silicon wafer or a fan-out wafer (epoxy wafer), and may have any suitable shape, such as round, rectangular, or triangular.

Next, referring to FIG. 13, a first layer 152 of passivation material is formed over the wafer 150, and openings 154 are formed in the layer over some or all of the submodule nodes 122, to form a second intermediate structure 155. The passivation material may be any suitable material such as silicon dioxide ($SiO_2$), benzocyclobutene (BCB), polybenzoxazole (PBO), or polyimide (PI), or any suitable combination of materials.

Then, referring to FIG. 14, a conductive material 156 is formed in the openings 154 (FIG. 13), a layer 157 of the conductive material is formed over the layer 152, and openings 158 are formed in the layer to form a third intermediate structure 159. The patterned layer 157 forms first conductive members of the interconnecting structure 112 (FIG. 1). The conductive material 156 may be any suitable conductive material such as aluminum, copper, or gold, or any suitable combination of conductive materials.

Next, referring to FIG. 15, a passivation material 160 is formed in the openings 158 (FIG. 14), a layer 161 of the passivation material is formed over the layer 157, and openings 162 are formed in the layer 161 over some or all of the first conductive members of the interconnect structure 112 (FIG. 12) to form a fourth intermediate structure 163.

Then, referring to FIG. 16, openings 164 are formed in a back side of the fourth intermediate structure 163 (FIG. 15) to expose some or all sections of the first conductive members of the interconnection structure 112 from the back side; this results in a fifth intermediate structure 165. The openings 164 may be formed in any suitable manner, such as for example, using a laser or a drill, and may taper inward in a direction toward the first conductive members of the interconnect structure 112.

Figure 17:
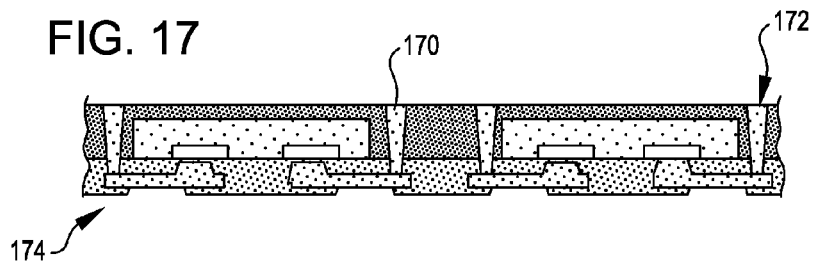

Next, referring to FIG. 17, the openings 164 (FIG. 16) are filled with a conductive material 170 to form vias 172 of the interconnect structure 112, resulting in a sixth intermediate structure 174. The openings 164 may be filled according to any suitable technique, such as one of the techniques disclosed in one of the following patent applications, which are incorporated by reference: U.S. patent application Ser. No. 12/982,697, entitled Through Hole Via Filling Using Electroless Plating, U.S. Patent App. Ser. No. 61/482,969 entitled Semiconductor Fan-Out Wafer Level Packaging And A Method Of Forming Metal Interconnect On 2-Side 3D Packaging, and U.S. patent application Ser. No. 13/098,083 entitled Through Hole Via Filling. Furthermore, the conductive material 170 may be any suitable conductive material, such as aluminum, copper, gold, or doped polysilicon, or any suitable combination of conductive materials.

Figure 18:
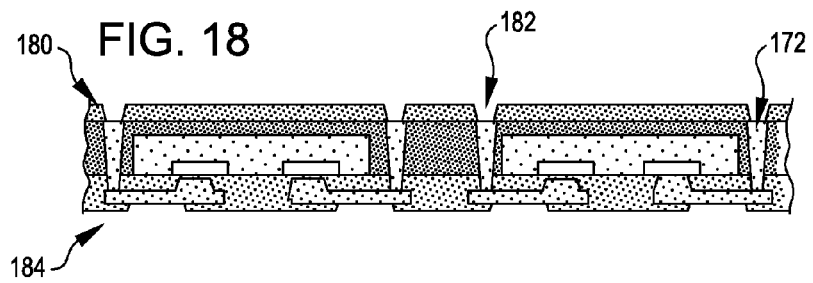

Then, referring to FIG. 18, a layer 180 of passivation material is formed over the sixth intermediate structure 174 (FIG. 17), and openings 182 are formed in the layer over the vias 172 to form a seventh intermediate structure 184. Alternatively, the steps described in conjunction with FIG. 18 may be omitted.

Figure 19:
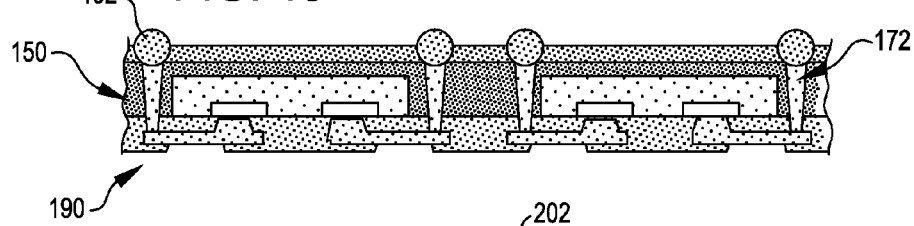
FIG. 19 is a cutaway side view of the circuit module of FIG. 10 at a subsequent stage of its manufacture according to an embodiment.

Next, referring to FIG. 19, to form the next intermediate structure 190 of the circuit module 100 of FIG. 10, solder balls 192 of the interconnect structure 112 are formed in the openings 182 (FIG. 18) in contact with the vias 172. Alternatively, if the layer 180 is omitted, then the solder balls 192 are formed over the backside of the wafer 150 in contact with the vias 172

Figure 20:
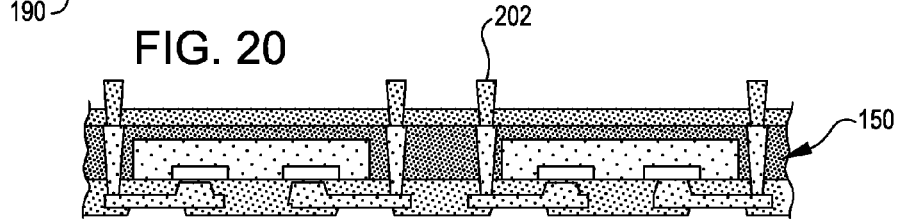
FIG. 20 is a cutaway side view of the circuit module of FIG. 11 at a subsequent stage of its manufacture according to an embodiment.

Alternative, referring to FIG. 20, to form the next intermediate structure 200 of the circuit module 140 of FIG. 11, conductive pillars 202 of the interconnect structure 112 are formed in the openings 182 (FIG. 18) in contact with the vias 172. Alternatively, if the layer 180 is omitted, then the conductive pillars 202 are formed over the backside of the wafer 150 in contact with the vias 172.

Figure 21:
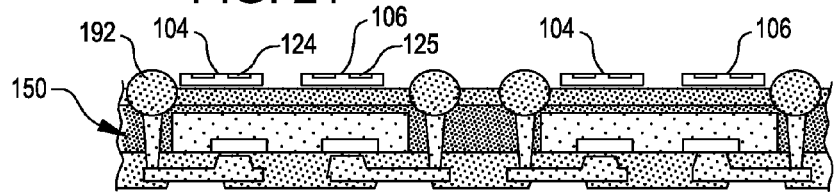
FIG. 21 is a cutaway side view of the circuit module of FIG. 10 at a subsequent stage of its manufacture according to an embodiment.

Then, referring to FIG. 21, to form the next intermediate structure 210 of the circuit module 100 of FIG. 10, the submodules 104 and 106 (and any other included submodules) are placed over the intermediate structure 190 (FIG. 18) in a space defined by the solder balls 192, with the submodule nodes 124 and 125 facing away from the intermediate structure 190. The submodules 104 and 106 may be placed with a pick-and-place machine, and may be attached to the passivation layer 180 with, for example, a thermally conductive adhesive. Alternatively, if the layer 180 is omitted, then the submodules 104 and 106 may be placed over, and may be attached to, the backside of the wafer 150. In an embodiment, the heights of the submodules 104 and 106 from the backside of the wafer 150 are approximately equal to the heights of the solder balls 192 from the backside of the wafer.

Figure 22:
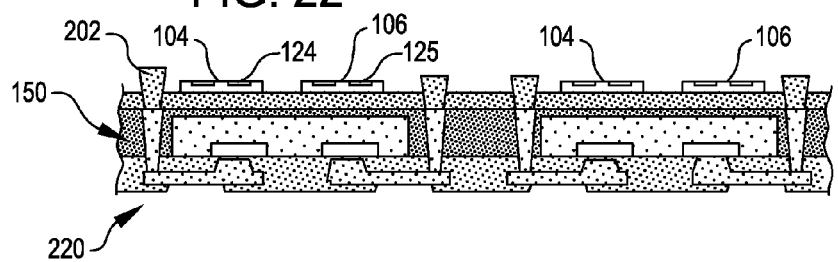
FIG. 22 is a cutaway side view of the circuit module of FIG. 11 at a subsequent stage of its manufacture according to an embodiment.

Alternatively, referring to FIG. 22, to form the next intermediate structure 220 of the circuit module 140 of FIG. 11, the submodules 104 and 106 (and any other included submodules) are placed over the intermediate structure 200 (FIG. 20) in a space defined by the conductive pillars 202, with the submodule nodes 124 and 125 facing away from the structure 200. The submodules 104 and 106 may be placed with a pick-and-place machine, and may be attached to the layer 180 with, for example, a thermally conductive adhesive. Alternatively, if the layer 180 is omitted, then the submodules 104 and 106 may be placed over, and may be attached to, the backside of the wafer 150. In an embodiment, the heights of the submodules 104 and 106 from the backside of the wafer 150 are approximately equal to the heights of the pillars 202 from the backside of the wafer.

Figure 23:
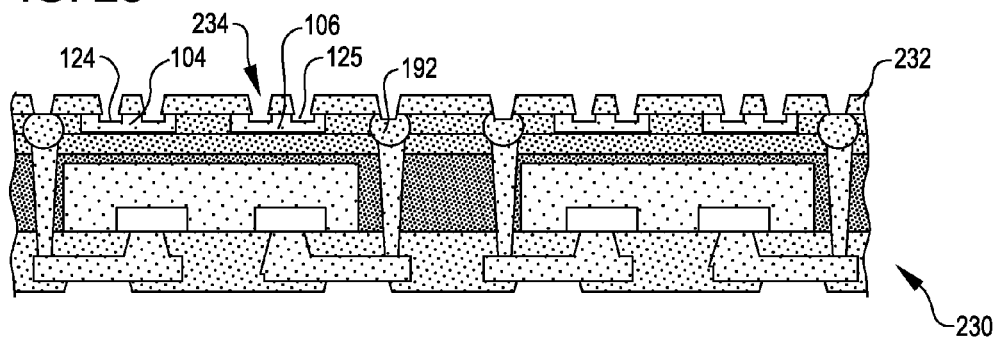
FIG. 23 is a cutaway side view of the circuit module of FIG. 10 at a subsequent stage of its manufacture according to an embodiment.

Next, referring to FIG. 23, to form the next intermediate structure 230 of the circuit module 100 of FIG. 10, a layer 232 of passivation material is formed over the submodules 104 and 106, and openings 234 are formed over some or all of the solder balls 192 and submodule nodes 124 and 125; the openings may extend into the solder balls.

Figure 24:
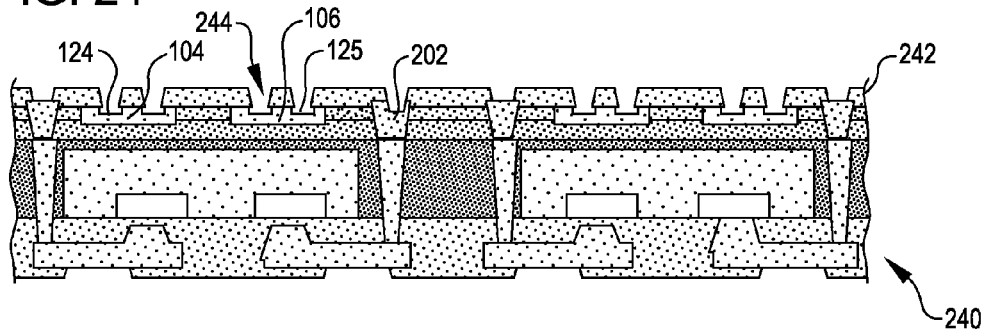
FIG. 24 is a cutaway side view of the circuit module of FIG. 11 at a subsequent stage of its manufacture according to an embodiment.

Alternatively, referring to FIG. 24, to form the next intermediate structure 240 of the circuit module 140 of FIG. 11, a layer 242 of passivation material is formed over the submodules 104 and 106, and openings 244 are formed over some or all of the pillars 202 and submodule nodes 124 and 125; the openings may extend into the pillars.

Figure 25:
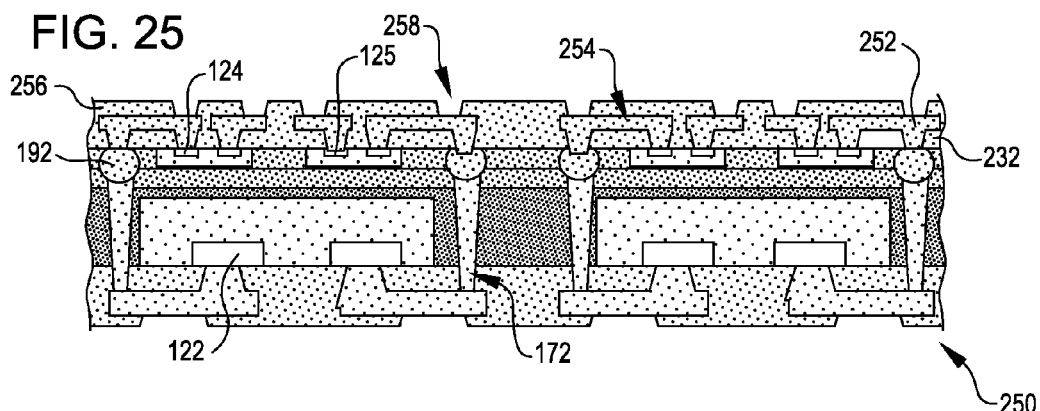
FIG. 25 is a cutaway side view of the circuit module of FIG. 10 at a subsequent stage of its manufacture according to an embodiment.

Then, referring to FIG. 25, to form the next intermediate structure 250 of the circuit module 100 of FIG. 10, a conductive material is formed in the openings 234 (FIG. 23), and a layer 252 of the conductive material is formed over the passivation layer 232 and is patterned to form conductive members 254 of the interconnection structure 112, a layer 256 of passivation material is formed over the conductive members, and openings 258 are formed over some or all of the conductive members. As discussed above in conjunction with FIG. 10, the conductive members 254 may intercouple the submodule nodes 124 and 125, and may couple ones of the submodule nodes 124 and 125 to the submodule nodes 122 or the module nodes 110 (FIG. 10) by way of the solder balls 192 and the vias 172.

Figure 26:
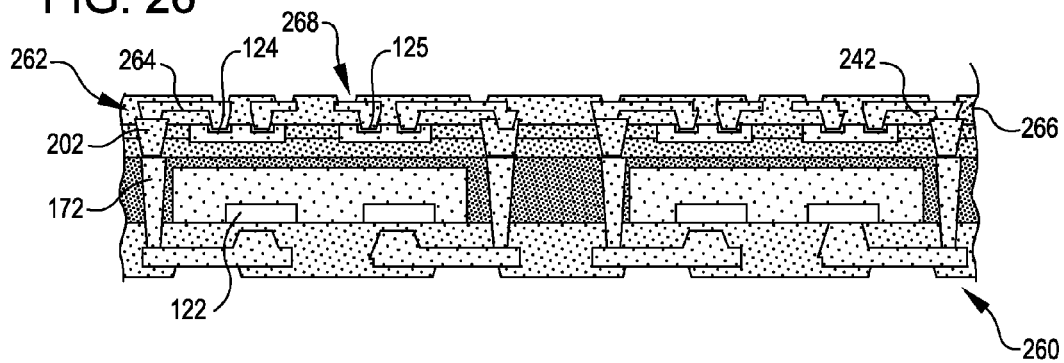
FIG. 26 is a cutaway side view of the circuit module of FIG. 11 at a subsequent stage of its manufacture according to an embodiment.

Alternatively, referring to FIG. 26, to form the next intermediate structure 260 of the circuit module 140 of FIG. 11, a conductive material is formed in the openings 244 (FIG. 24), and a layer 262 of the conductive material is formed over the passivation layer 242 and patterned to form conductive members 264 of the interconnection structure 112, a layer 266 of passivation material is formed over the conductive members, and openings 268 are formed over some or all of the conductive members. As discussed above in conjunction with FIG. 11, the conductive members 264 may intercouple the submodule nodes 124 and 125, and may couple ones of the submodule nodes 124 and 125 to the submodule nodes 122 or the module nodes 110 (FIG. 11) by way of the conductive pillars 202 and the vias 172.

Figure 27:
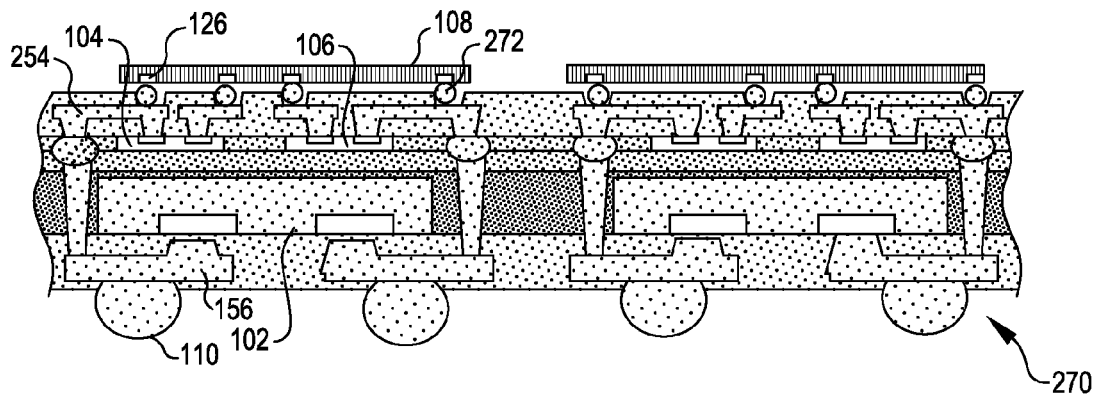
FIG. 27 is a cutaway side view of the circuit module of FIG. 10 at a subsequent stage of its manufacture according to an embodiment.

Next, referring to FIG. 27, to form the next intermediate structure 270 of the circuit module 100 of FIG. 10, solder balls 272 of the interconnect structure 112 are formed in the openings 258 (FIG. 25) in contact with respective conductive members 254, and the submodule 108 is disposed over the submodules 102, 104, and 106 such that some or all of the submodule nodes 126 respectively contact the solder balls 272. Alternatively, the solder balls 272 may be formed on the respective submodule nodes 126 first, and then the submodule 106 is placed such that the solder balls engage the respective openings 258 and contact the respective conductive members 254. Furthermore, solder balls are formed in the openings 162 (FIG. 16) in respective contact with the conductive members 156 to form the module nodes 110.

Then, referring to FIGS. 10 and 27, the circuit modules 100 are spliced from the intermediate structure 270. The circuit modules 100 may then be encapsulated in a packaging material (not shown) such as epoxy, or may remain unencapsulated.

Figure 28:
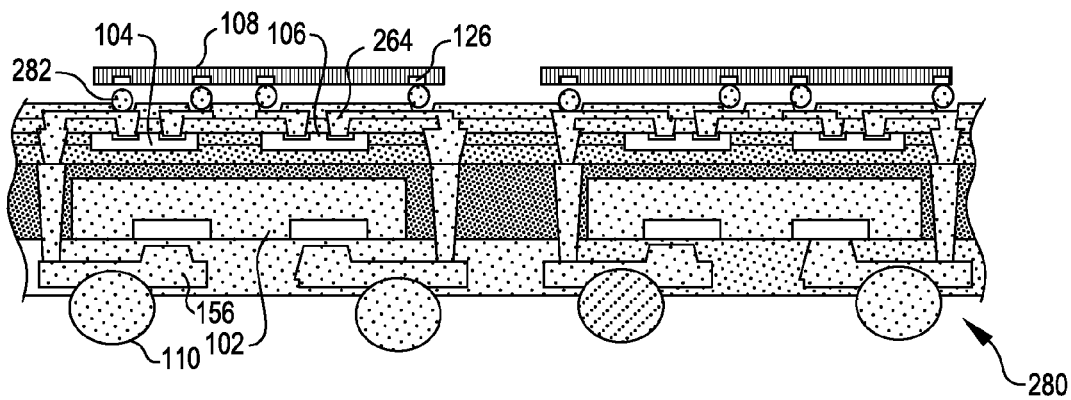
FIG. 28 is a cutaway side view of the circuit module of FIG. 11 at a subsequent stage of its manufacture according to an embodiment.

Alternatively, referring to FIG. 28, to form the next intermediate structure 280 of the circuit module 140 of FIG. 11, solder balls 282 of the interconnect structure 112 are formed in the openings 268 (FIG. 26) in contact with respective conductive members 264, and the submodule 108 is disposed over the submodules 102, 104, and 106 such that some or all of the submodule nodes 126 respectively contact the solder balls 282. Alternatively, the solder balls 282 may be formed on the respective submodule nodes 126 first, and then the submodule 108 is placed such that the solder balls engage the respective openings 268 and contact the respective conductive members 264. Furthermore, solder balls are formed in the openings 162 (FIG. 16) in respective contact with the conductive members 156 to form the module nodes 110.

Next, referring to FIGS. 11 and 28, the circuit modules 140 are spliced from the intermediate structure 280. The circuit modules 140 may then be encapsulated in a packaging material (not shown) such as epoxy, or may remain unencapsulated.

Referring to FIGS. 10-28, alternate embodiments of the circuit modules 100 and 140, and the process for manufacturing these circuit modules, are contemplated. For example, other types of contacts may be used in place of one or more of the solder balls, conductive pillars, or pads.

Figure 29:
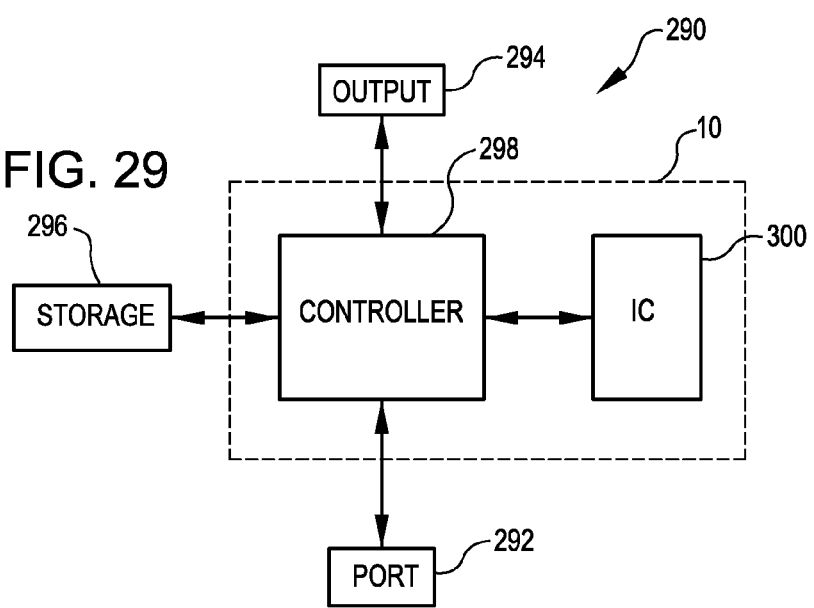
FIG. 29 is a block diagram of a system that includes at least one of the circuit modules of FIGS. 1, 10, and 11 according to an embodiment.

FIG. 29 is a block diagram of an embodiment of a system 290, which may include one or more of the circuit modules 10, 100, and 140 of FIGS. 1, 10, and 11 according to an embodiment. For purposes of illustration, the system 290 is hereinafter described as including one circuit module 10, it being understood that the system may include multiple circuit modules 10, a single or multiple circuit modules 100 and 140, or a combination of the circuit modules 10, 100, and 140.

Examples of the system 290 include a computer system, a smart phone, a computer pad, and a portable music device.

In addition to the circuit module 10, the system 290 includes an input device 292, such as a key pad, an output device 294, such as a display screen, and a storage device 296, such as a disk drive.

The circuit module 10 includes a controller 298, such as a microprocessor or microcontroller, and an integrated circuit 300, such as a memory, coupled to the controller. The controller 298 is also coupled to the input device 292, output device 294, and storage device 296.

Still referring to FIG. 29, alternate embodiments of the system 290 are contemplated. For example, although shown as being disposed on the same circuit module 10, the controller 298 and integrated circuit 300 may be on respective circuit modules, or one of the controller and integrated circuit may not be disposed on a circuit module.

While the subject matter discussed herein is susceptible to various modifications and alternative constructions, certain illustrated embodiments thereof are shown in the drawings and have been described above in detail. It should be understood, however, that there is no intention to limit the claims to the specific forms disclosed, but on the contrary, the intention is to cover all modifications, alternative constructions, and equivalents falling within the spirit and scope of the disclosure.

What is claimed is:

1. A circuit module, comprising:
   module nodes;
   a first submodule having a first semiconductor die having a first submodule node;
   a second submodule having a second semiconductor die with a smaller area footprint than a footprint of the first semiconductor die disposed over the first submodule and having a second submodule node; and
   a conductive structure that electrically couples the first submodule node to one of the module nodes without coupling the first submodule node to the second submodule and that electrically couples the second submodule node to one of the module nodes without coupling the second submodule node to the first submodule, the conductive structure including a plurality of layers, one of the layers extending from the first submodule and having a height measured from a surface of the first submodule that is equal to a height of the second submodule node measured from the surface of the first submodule.

2. The circuit module of claim 1 wherein the module nodes include conductive balls.

3. The circuit module of claim 1 wherein the module nodes include conductive pads.

4. The circuit of claim 1 wherein one of the first and second submodules includes an integrated-circuit die.

5. The circuit module of claim 1 wherein one of the first and second submodules includes an integrated-circuit package and an integrated-circuit die disposed within the package.

6. The circuit module of claim 1 wherein:
   the first submodule node is disposed on a side of the first submodule that faces a direction; and
   the second submodule node is disposed on a side of the second submodule that faces approximately the direction.

7. The circuit module of claim 1 wherein:
   the first submodule node is disposed on a side of the first submodule that faces a direction; and
   the second submodule node is disposed on a side of the second submodule that faces another direction.

8. The circuit module of claim 1 wherein:
   the first submodule has multiple first submodule nodes that define a space; and
   the second submodule is disposed within the space.

9. The circuit module of claim 1 wherein the second submodule is attached to the first submodule.

10. The circuit module of claim 1 wherein the second submodule is separated from the first submodule.

11. The circuit module of claim 1 wherein the conductive structure electrically couples the first and second submodule nodes to a same module node.

12. The circuit module of claim 1 wherein the conductive structure electrically couples the first and second submodule nodes to respective module nodes.

13. The circuit module of claim 1, further including:
module sides; and
wherein the conductive structure is disposed only on one of the module sides.

14. The circuit module of claim 1, further including:
first and second module sides;
wherein the conductive structure includes a first portion coupled to one of the first and second submodule nodes and disposed on the first module side;
wherein the conductive structure includes a second portion coupled to one of the module nodes and disposed on the second module side; and
wherein the conductive structure includes a conductive via that couples the first portion of the conductive structure to the second portion of the conductive structure.

15. The circuit module of claim 1, further including:
a third submodule disposed over one of the first and second submodules and having a third submodule node; and
wherein the conductive structure electrically couples the third submodule node to one of the module nodes.

16. The circuit module of claim 1, further including:
a third submodule disposed over one of the first and second submodules and having a third submodule node; and
wherein the conductive structure electrically couples the third submodule node to one of the first and second submodule nodes.

17. The circuit module of claim 1 wherein one of the first and second submodules includes a controller.

18. A system, comprising:
a circuit module, including:
module nodes;
a first submodule having a first semiconductor die having first submodule nodes;
a second submodule having a second semiconductor die with a smaller area footprint than a footprint of the first semiconductor die disposed over the first submodule and having second submodule nodes; and
a conductive structure that electrically couples one of the first and second submodule nodes to one of the module nodes without coupling the first submodule node to the second submodule and without coupling the second submodule node to the first submodule and that electrically couples one of the first submodule nodes to one of the second submodule nodes, the conductive structure including a plurality of layers, one of the layers extending from the first submodule and having a height measured from a surface of the first submodule that is equal to a height of one of the second submodule nodes measured from the surface of the first submodule; and
an integrated circuit coupled to the circuit module.

19. The system of claim 18 wherein one of the circuit module and integrated circuit includes a controller.

* * * * *